(12) United States Patent
Chen et al.

(10) Patent No.: US 9,373,709 B2
(45) Date of Patent: Jun. 21, 2016

(54) ALL-ELECTRIC SPIN FIELD EFFECT TRANSISTOR

(71) Applicant: NATIONAL CHENG KUNG UNIVERSITY, Tainan (TW)

(72) Inventors: Tse-Ming Chen, Tainan (TW); Sheng-Chin Ho, Taoyuan (TW); Pojen Chuang, Kaohsiung (TW)

(73) Assignee: NATIONAL CHENG KUNG UNIVERSITY, Tainan (TW)

( * ) Notice: Subject to any disclaimer, the term of this patent is extended or adjusted under 35 U.S.C. 154(b) by 0 days.

(21) Appl. No.: 14/738,557

(22) Filed: Jun. 12, 2015

(65) Prior Publication Data

US 2015/0364583 A1   Dec. 17, 2015

(30) Foreign Application Priority Data

Jun. 12, 2014   (TW) .............................. 103120263 A

(51) Int. Cl.

| H01L 29/66 | (2006.01) |
|---|---|
| H01L 29/06 | (2006.01) |
| H01L 29/41 | (2006.01) |
| H01L 29/12 | (2006.01) |
| H01L 29/10 | (2006.01) |
| H01L 29/205 | (2006.01) |
| H01L 29/423 | (2006.01) |
| H01L 29/778 | (2006.01) |

(52) U.S. Cl.
CPC ...... *H01L 29/66984* (2013.01); *H01L 29/0673* (2013.01); *H01L 29/1029* (2013.01); *H01L 29/127* (2013.01); *H01L 29/205* (2013.01); *H01L 29/41* (2013.01); *H01L 29/42372* (2013.01); *H01L 29/42356* (2013.01); *H01L 29/778* (2013.01)

(58) Field of Classification Search
CPC .................... H01L 29/66984; H01L 29/0673; H01L 29/125; H01L 29/122
See application file for complete search history.

(56) References Cited

PUBLICATIONS

Mireles et al. "Ballistic spin-polarized transport and Rashba spin precession in semiconductor nanowires," Phys. Rev. B. vol. 62 024426-1, 2001.*
Datta et al, "Electronic analog of the electro-optic modulator," Applied Physics Letters, 1990, p. 665-667, vol. 56, No. 7.
F. Mireles, "Ballistic spin-polarized transport and Rashba spin precession in semiconductor nanowires," Phys. Rev. B., vol. 62, 2001, pp. 1-19.

* cited by examiner

*Primary Examiner* — Matthew Reames
(74) *Attorney, Agent, or Firm* — Muncy, Geissler, Olds & Lowe, P.C.

(57) ABSTRACT

An all-electric spin field effect transistor is disclosed, which includes an injection node, injecting an electron in a first spin direction; a detection node, detecting the electron in the first spin direction; and a gate, disposed between the injection node and the detection node such that the electron changes from the first spin direction to a second spin direction by carrying out precession; if the second spin direction is parallel to the first spin direction, the electron is able to pass through the detection node; if the second spin direction is antiparallel to the first spin direction, the electron is unable to pass through the detection node.

10 Claims, 3 Drawing Sheets

ALL-ELECTRIC SPIN FIELD EFFECT TRANSISTOR

CROSS-REFERENCE TO RELATED APPLICATION

This application claims priority from Taiwan Patent Application No. 103120263, filed on Jun. 12, 2014, in the Taiwan Intellectual Property Office, the content of which are hereby incorporated by reference in their entirety for all purposes.

BACKGROUND OF THE INVENTION

1. Field of the Invention

The present invention relates to a spin field effect transistor, in particular to an all-electric spin field effect transistors.

2. Description of the Related Art

The spin field effect transistor (Spin FET) is a concept proposed by Supriyo Datta and Biswajit A. Das in the journal of Appl. Phys. Lett. 56, 665 (1990) at the earliest time. In the proposed structure thereof, the source electrode and the drain electrode act as an injection node and a detection node respectively for the spinning electrons by adopting ferromagnetic materials. When the bias voltage of the gate is 0, the spinning electrons from the injection node may arrive the detection node through the passage of two-dimensional electron gas (2DEG) formed by semiconductor heterojunction; when the bias voltage of the gate is not 0, the electric field in the passage will undergo changes (such as the electric field perpendicular to the direction of the passage increases or decreases). At this time, these changes of the electric field will also change the equivalent magnetic field which affects the moving electrons (Rashba effect) and thus affects the precession speed of spin for electrons. It is also equivalent that the direction of the electron spin may be controlled by the magnitude of the applied external electric field, thereby affecting whether the electron spin current passes through or not (based on the angle difference between the spin and the detection node, passing through if parallel and not passing through if antiparallel).

However, the spin injection efficiency of ferromagnetic materials and semiconductor heterojunction is currently very low, and an applied external magnetic field is required to change the direction of spin polarization for the injection node and the detection node. In addition, the factors such as the spin lifetime of the electron spin and the phase spread of the electron spin are also great problems to realize the spin field effect transistors.

SUMMARY OF THE INVENTION

In view of the above problems of the conventional techniques, the objective of the present invention is to provide an all-electric method as an only means to control the spin field effect transistor without need to make use of ferromagnetic materials, applied external magnetic field or optical elements to control the electron spin.

According to the objective of the present invention, an all-electric spin field effect transistor is provided, which includes: an injection node, this node providing a first electric field in a second direction. According to the Rashba effect, when an electron passes through the injection node along a first direction, the electron spin will be polarized and only electron in a first spin direction taking a third direction as a rotational axis to carry out precession can pass through; a detection node, this node providing a second electric field with direction same as the first electric field. According to the Rashba effect, when the electron passes through the detection node along the first direction, the direction of electron spin will be detected and only electron in the first spin direction taking the third direction as a rotational axis to carry out the precession can pass through (in practical case, "pass through" described in the text depends on COSINE value. If the rotational axis of the precession carried out by the electron is parallel to the third direction, it passes through completely. If the rotational axis of the precession carried out by the electron is antiparallel to the third direction, it does not pass through at all. If the rotational axis of the precession carried out by the electron and the third direction is with the in-between angle, it passes through partially); a gate, disposed between the injection node and the detection node, the gate providing a third electric field in a third direction such that the electron takes the second direction as a rotational axis to carry out precession from the first spin direction; if the direction of electron spin precesses to be parallel to the first spin direction, the electron is able to pass through the detection node; if this direction of electron spin precesses to be antiparallel to the first spin direction, the electron is unable to pass through the detection node.

The injection node and the detection node may respectively include electrode pairs. These electrode pairs provide a bias voltage respectively to generate the first electric field in the second direction and the second electric field in the second direction. Wherein, such as a quantum wire or a quantum point contact (QPC) may be formed between the electrode pairs.

The injection node and the detection node may be disposed at upper side or both sides of a semiconductor heterojunction. The gate may be disposed on the semiconductor heterojunction such that the semiconductor heterojunction forms a passage that the electron moves along the first direction.

The injection node and the detection node may include an electrode respectively, and these electrodes may be disposed on both sides of a passage above the gate without contacting the passage. Wherein the passage may be a nanowire.

The first electric field pointing to the second direction provided by the injection node and the second electric field pointing to the second direction provided by the detection node may further induce a first magnetic field in the third direction and a second magnetic field in the third direction to inject and detect the electron in the first spin direction respectively.

The third electric field pointing to the third direction provided by the gate may further induce a third magnetic field in the second direction such that the electron changes from the first spin direction to the second spin direction by taking the second direction as the rotational axis to carry out precession.

The first direction, the second direction and the third direction are perpendicular to each other.

According to the above, the all-electric spin field effect transistor of the present invention may have one or more advantages described below:

(1) The all-electric spin field effect transistor of the present invention makes use of the quantum wire or the quantum point contact formed by the electrode pairs of the injection node and the detection node such that the direction of spin polarization of electron may be changed only by the applied external voltage without need to make use of ferromagnetic materials, applied external magnetic field or other optical elements.

(2) The injection node and the detection node of the all-electric spin field effect transistor of the present invention may enhance the spin injection efficiency of the injection node and the semiconductor junction effectively.

In order to facilitate the further comprehension and understanding of the technical features and the effects achieved of the present invention, the present invention will be illustrated below with reference to preferable embodiments and detailed descriptions.

DETAILED DESCRIPTION OF THE PREFERRED EMBODIMENTS

Figure 1:
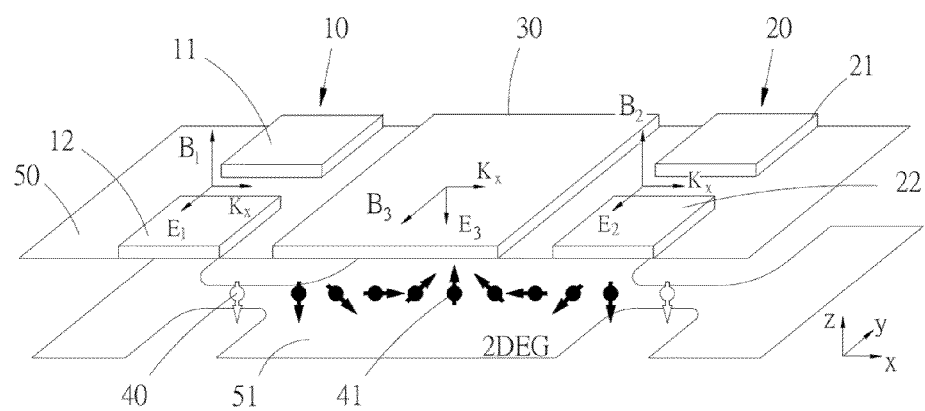
FIG. 1 is a schematic view of the first embodiment of the all-electric spin field effect transistor of the present invention.

The embodiments according to the all-electric spin field effect transistor of the present invention will be illustrated with reference to the relevant figures. For the ease of understanding, the same elements in the following embodiments are described by the same reference numerals.

Please refer to FIG. 1, which is a schematic view of the first embodiment of the all-electric spin field effect transistor of the present invention. The first embodiment of the all-electric spin field effect transistor of the present invention at least includes an injection node 10, a detection node 20 and a gate 30. Wherein, the first, second and third directions described below takes x, y and z directions for example respectively, but the present invention is not limited thereto.

The injection node 10 is used to inject an electron 40 in a first spin direction such that the electron 40 moves along the first direction $K_x$ (e.g., x direction). The injection node 10 may include an electrode pair 11 and 12, and the electrode pair 11 and 12 applies a bias voltage to generate a first electric field $E_1$ in the second direction (e.g., y direction) such that the injection node 10 induces a first magnetic field $B_1$ in the third direction (e.g., z direction), and then injects the electron 40 in the first spin direction through changing the direction of spin polarization of electron of the injection node 10 by the first magnetic field $B_1$. Wherein, a quantum wire or a quantum point contact (QPC) may be formed between the electrode pair 11 and 12.

The detection node 20 is used to detect the electrons 40 in the first spin direction. The detection node 20 may include electrode pair 21 and 22, and the electrode pair 21 and 22 applies a bias voltage to generate a second electric field $E_2$ in the second direction such that the detection node 20 induces a second magnetic field $B_2$ in the third direction, and then detects the electron 40 in the first spin direction by the second magnetic field $B_2$. Wherein, a quantum wire or a quantum point contact (QPC) may be formed between the electrode pair 21 and 22.

The gate 30 is disposed between the injection node 10 and the detection node 20. The gate 30 applies a third electric field $E_3$ in the third direction such that the gate 30 induces a third magnetic field $B_3$ in the second direction, and then the electron 40 passing through the gate 30 in the first spin direction changes to an electron 41 in the second spin direction by taking the second direction as a rotational axis to carry out precession. Wherein, if the second spin direction is parallel to the first spin direction, the electron is able to pass through the detection node such that a current may be detected by a drain of the all-electric spin field effect transistor; on the contrary, if the second spin direction is antiparallel to the first spin direction, the electron is unable to pass through the detection node such that the current may not be detected by the drain of the all-electric spin field effect transistor.

In addition, the injection node 10, the detection node 20 and the gate 30 are disposed on a semiconductor heterojunction 50 such that the semiconductor heterojunction 50 forms a two dimensional electron gas (2 DEG) passage 51 that the electron moves along the first direction. Wherein, the semiconductor heterojunction 50 may be indium gallium arsenide/indium aluminum arsenide (InGaAs/InAlAs) etc, but the present invention is not limited thereto.

Figure 2:
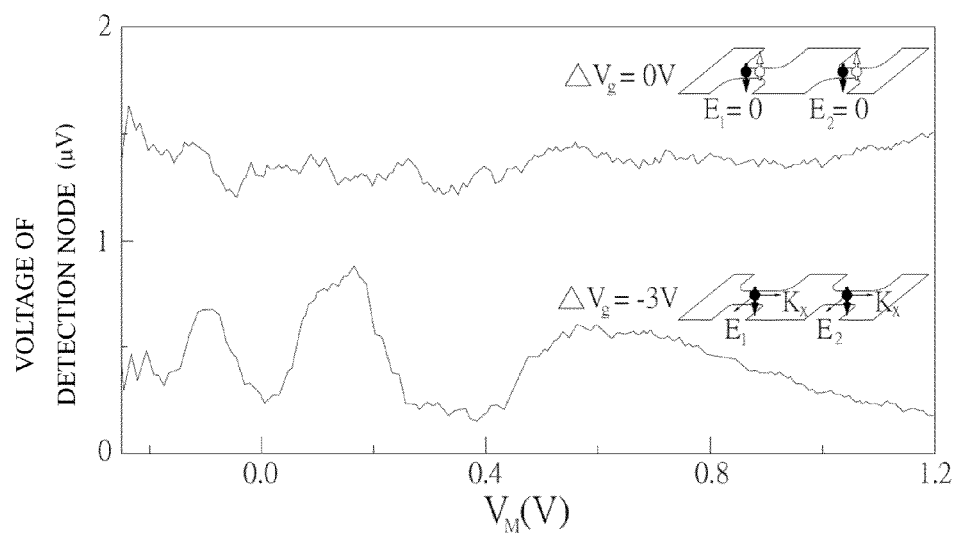
FIG. 2 is a curve for voltage of detection node—voltage of gate of the all-electric spin field effect transistor of the present invention.

Please refer to FIG. 1 and FIG. 2, in which FIG. 2 is a curve for voltage of detection node—voltage of gate of the all-electric spin field effect transistor of the present invention. Wherein, $\Delta V_g$ is a voltage difference between the electrode pair 11 and 12 and a voltage difference between the electrode pair 21 and 22, i.e. $\Delta V_g = V_{11}-V_{12} = V_{21}-V_{22}$.

The exemplary operation of the all-electric spin field effect transistor of the present invention sets the conductance of the quantum wire or the quantum point contact of the injection node 10 and the detection node 20 $G_{QPC}=0.3 \times 2e^2/h$ and $\Delta V_g=-3V$, where e is an electric charge quantity of an electron and h is Planck constant. Besides, in order to observe specifically the voltage change of the detection node 20 with different gate voltage $V_M$ under the conditions of $\Delta V_g=-3$ and $\Delta V_g=0$, the voltages of both detection nodes 20 are shifted with 1 μV.

As one may observe from FIG. 2, when the voltage difference between the electrode pair 11 and 12 and the voltage difference between the electrode pair 21 and 22 $\Delta V_g=0$, the voltage of the detection node 20 does not change significantly; and when the voltage difference between the electrode pair 11 and 12 and the voltage difference between the electrode pair 21 and 22 $\Delta V_g=-3$, the voltage change of the detection node 20 can be significantly observed. This result shows that the all-electric spin field effect transistor of the present invention may change the direction of spin polarization of electron only by the applied external voltage of the injection node 10 and the detection node 20, and may change the precession velocity of the electron spin by the applied external voltage of the gate 30 to control whether the current of the detection node 20 flow through or not (i.e. the state of on/off).

Furthermore, as one may know from the curve for voltage of detection node—voltage of gate, the variance between the maximum current and the minimum current may be up to five times the minimum current (i.e. $(I_{max}-I_{min})/I_{min}$ 500%). Thus, the state of on/off of the all-electric spin field effect transistor of the present invention may be effectively controlled by the gate voltage $V_M$.

Figure 3:
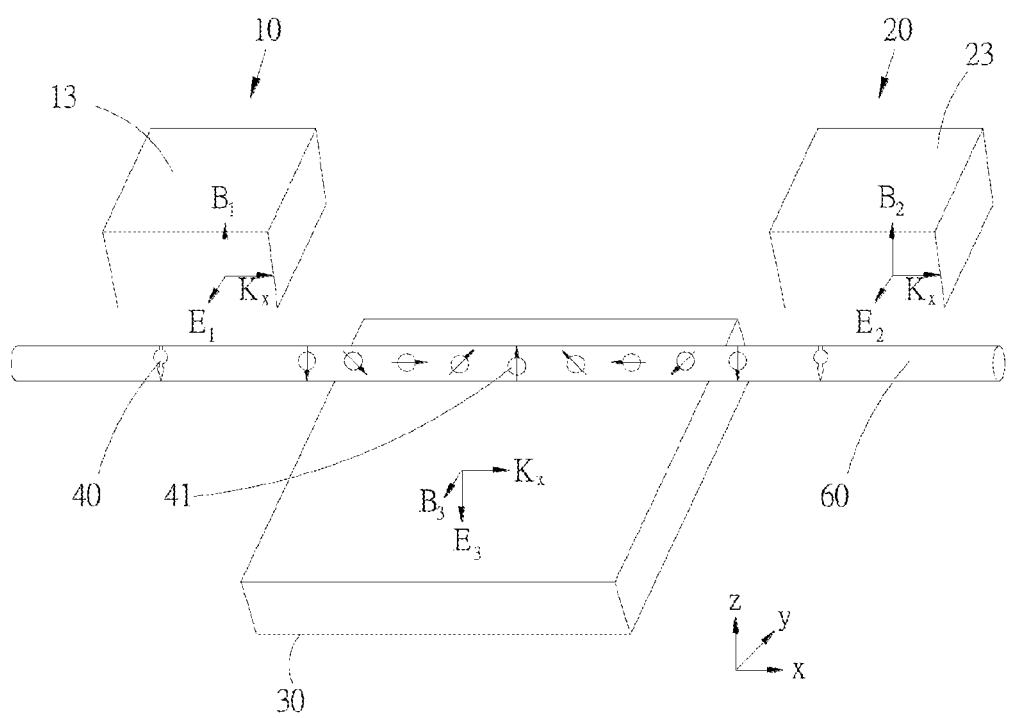
FIG. 3 is a schematic view of the second embodiment of the all-electric spin field effect transistor of the present invention.

Please refer to FIG. 3 which is a schematic view of the second embodiment of the all-electric spin field effect transistor of the present invention. The difference between the second embodiment and the first embodiment mainly is that the nanowire 60 is used as a passage for electron moving from the injection node 10 to the detection node 20.

The second embodiment of the all-electric spin field effect transistor of the present invention at least includes an injection node 10, a detection node 20 and a gate 30. Wherein, the first, second and third directions described below takes x, y and z directions for example respectively, but the present invention is not limited thereto.

The injection node 10 is used to inject an electron 40 in a first spin direction such that the electron 40 moves along the first direction. The injection node 10 may include an electrode 13 to generate a first electric field $E_1$ in the second direction by applying a bias voltage such that the injection node 10 induces a first magnetic field $B_1$ in the third direction, and then injects the electron 40 in the first spin direction into the nanowire 60 through changing the direction of spin polarization of electron of the injection node 10 by the first magnetic field $B_1$.

The detection node 20 is used to detect the electrons 40 in the first spin direction. The detection node 20 may include an electrode 23 to generate a second electric field $E_2$ in the second direction by applying a bias voltage such that the detection node 20 induces a second magnetic field $B_2$ in the third direction, and then detects the electron 40 in the first spin direction in the nanowire 60 by the second magnetic field $B_2$.

The gate 30 is disposed between the injection node 10 and the detection node 20. The gate 30 applies a third electric field $E_3$ in the third direction such that the gate 30 induces a third magnetic field $B_3$ in the second direction, and then the electron 40 passing through the nanowire 60 above the gate 30 in the first spin direction changes to an electron 41 in the second spin direction by taking the second direction as a rotational axis to carry out precession. Wherein, the electrodes 13 and 23 may be disposed on both sides of the nanowire 60 above the gate 30 respectively without contacting the nanowire 60.

Since those skills in the relevant technical field of the present invention may understand the technical effects to be achieved of the second embodiment of the present invention according to the first embodiment described above, the description thereof will not be repeated herein.

In conclusion, the all-electric spin field effect transistor of the present invention not only can effectively enhance the electron spin injection efficiency, but also can control the direction of spin polarization of electron without need to make use of ferromagnetic materials, applied external magnetic field or other optical elements. It is valuable to the applications of industry.

The above description is only illustrative, but is not restrictive. Any disclosures without departing from the spirit and scope of the present invention and its equivalent modifications or changes made, should be enclosed within the scope of the appended claims.

What is claimed is:

1. An all-electric spin field effect transistor, comprising:
   an injection node configured to generate a first electric field to polarize an electron in a first spin direction while the electron passes through the injection node along a first direction, wherein the first electric field is generated in a second direction;
   a detection node configured to generate a second electric field in the second direction to detect the electron in the first spin direction; and
   a gate disposed between the injection node and the detection node and configured to generate a third electric field in a third direction such that the electron changes from the first spin direction to a second spin direction by taking the second direction as a rotational axis to carry out precession, such that if the second spin direction is parallel to the first spin direction, the electron is able to pass through the detection node, if the second spin direction is antiparallel to the first spin direction, the electron is unable to pass through the detection node.

2. The all-electric spin field effect transistor of claim 1, wherein the injection node and the detection node comprise electrode pairs respectively.

3. The all-electric spin field effect transistor of claim 2, wherein the electrode pairs provide a bias voltage respectively to generate the first electric field in the second direction and the second electric field in the second direction.

4. The all-electric spin field effect transistor of claim 3, wherein a quantum wire or a quantum point contact (QPC) is formed between the electrode pairs.

5. The all-electric spin field effect transistor of claim 2, wherein the injection node, the detection node and the gate are disposed on a semiconductor heterojunction such that the semiconductor heterojunction forms a passage that the electron moves along the first direction.

6. The all-electric spin field effect transistor of claim 1, wherein the injection node and the detection node comprise an electrode respectively, and the electrodes are disposed on both sides of a passage without contacting the passage.

7. The all-electric spin field effect transistor of claim 6, wherein the passage is a nanowire.

8. The all-electric spin field effect transistor of claim 1, wherein the first electric field in the second direction provided by the injection node and the second electric field in the second direction provided by the detection node further induce a first magnetic field in the third direction and a second magnetic field in the third direction to inject and detect the electron in the first spin direction respectively.

9. The all-electric spin field effect transistor of claim 8, wherein the third electric field in the third direction provided by the gate further induces a third magnetic field in the second direction such that the electron changes from the first spin direction to the second spin direction by taking the second direction as the rotational axis to carry out precession.

10. The all-electric spin field effect transistor of claim 1, wherein the first direction, the second direction and the third direction are perpendicular to each other.

* * * * *